United States Patent [19]
Miller

[11] 4,445,134
[45] Apr. 24, 1984

[54] CONDUCTIVITY WSI$_2$ FILMS BY PT PREANNEAL LAYERING

[75] Inventor: Robert J. Miller, Yorktown Heights, N.Y.

[73] Assignee: IBM Corporation, Armonk, N.Y.

[21] Appl. No.: 318,181

[22] Filed: Nov. 4, 1981

Related U.S. Application Data

[62] Division of Ser. No. 214,170, Dec. 8, 1980, Pat. No. 4,322,453.

[51] Int. Cl.$^3$ .................... H01L 23/48; H01L 29/46; H01L 29/62; H01L 29/64
[52] U.S. Cl. .................................... 357/71; 357/67; 357/65
[58] Field of Search .................. 357/67 S, 71 S, 65

[56] References Cited
U.S. PATENT DOCUMENTS 3,906,540  9/1975  Hollins ........................... 357/67 X
4,285,761  8/1981  Fatula, Jr. et al. ............. 357/67 X
4,329,706  5/1982  Crowder et al. ................. 357/71

OTHER PUBLICATIONS

A. K. Sinha, "Electrical Characteristics and Thermal Stability of Platinum Silicide-to-Silicon Ohmic Contacts Metalized with Tungsten," *Journal of the Electrochemical Society*, vol. 120, No. 7, Jul. 1973, pp. 1767-1771.

Primary Examiner—Andrew J. James
Assistant Examiner—Seth M. Nehrbass
Attorney, Agent, or Firm—Sughrue, Mion, Zinn, Macpeak & Seas

[57] ABSTRACT

A highly conductive layer utilizing a layer of Pt in conjunction with sputter deposited or co-evaporated WSi$_2$ to enhance the conductivity increase of the WSi$_2$ layer occuring during annealing. The Pt layer is deposited as a thin layer directly on top or beneath the WSi$_2$ layer or may be incorporated within the WSi$_2$ layer. During annealing platinum atoms diffuse into the WSi$_2$ film resulting in lower resistivity values than in comparably deposited annealed film wherein the Pt layer has been omitted.

4 Claims, 6 Drawing Figures

CONDUCTIVITY WSi$_2$ FILMS BY PT PREANNEAL LAYERING

This is a division of application Ser. No. 214,170, filed Dec. 8, 1980, U.S. Pat. No. 4,322,453.

TECHNICAL FIELD

This invention relates to semiconductor devices and in particular to WSi$_2$ highly conductive layers for contacts and conductors of semiconductor devices and for FET gates.

PRIOR ART

Tungsten silicide (WSi$_2$) has been known to have metallic conductivity and relatively low electrical resistivity. Typical ranges are approximately 33 $\mu\Omega$-cm in bulk form, as described in the CRC Handbook of Chemistry and Physics, (1980). However, only recently has it been recognized that low resistivity is achieved in thin films of tungsten silicide. With this development, reported by Crowder and Zirinsky, IEEE J. Solid-State Circuits, SC-14,291 (1979); Mohammadi and Saraswat J-Electrochem. Soc., 127, 450 (1980), it has become apparent that tungsten silicide thin films potentially have microelectronic applications.

The method employed in the prior art Crowder and Zirinsky proposal for depositing thin films used the technique of co-evaporation followed by annealing in an oxygen-free atmosphere temperatures ranging 800° C.-1,000° C. In co-evaporation the thin film is deposited onto a substrate while placed in a high-vacuum chamber. Two evaporation sources, one containing tungsten and the other silicon, are heated to temperatures such that evaporation of atoms from each source occurs. The atoms travel through the high vacuum of the evaporation chamber until they reach and adhere to a relatively colder surface. Some of the evaporated atoms therefore, impinge and condense onto substrates placed withing the chamber. The rates of evaporation and therefore the deposition onto the substrates, are critically dependent on the temperatures to which the sources are heated. To establish a thin film compound of given stoichiometry by co-evaporation, it is necessary to measure and control the evaporation rates of two sources simultaneously. Hence, advanced equipment and control methods are required to adequately control the stoichiometry of thin films of tungsten silicide deposited by co-evaporation.

A WSi$_2$ layer may be employed as a highly conductive layer for FET gates. In the fabrication of FET devices, the substrate is likely to possess chemical vapor deposited polycrystalline silicon as its top-most layer onto which the WSi$_2$ is co-evaporated. The resulting structure is a two-layer element comprising co-evaporated WSi$_2$ on top of polycrystalline silicon. The structure so formed is capable of withstanding high temperature processing, is self-passivating, and generally can be 10 times lower in sheet resistance than the heavily doped polycrystalline silicon layer of the same total thickness. However, despite the advantages in the resulting structure, the process conditions are difficult to maintain because it is necessary to independently monitor and control in tandem the deposition rates from two evaporation sources operating simultaneously. The control of rates of deposition is crucial to prevent either source from pulling the film composition away from the stoichiometry. When deviation from stoichiometry occurs, the properties of the film surffer. Electrical conductivity is decreased and the ability of the film to passivate itself under oxidizing annealing conditions can be inhibited.

Within the prior art, other techniques for deposition of thin films of tungsten silicide have been proposed, most typically sputtering. A comprehensive review of the theory of sputtering and the application of both dc and rf sputtering methods for the deposition of thin films is presented in the "Handbook of Thin Film Technology," L. I. Maissel and R. Glang, McGraw Hill, 1970. In the sputter deposition of thin films, atoms are liberated from a source of target when inert gas ions electrically accelerated to a high kinetic energy strike the source. Liberated atoms then travel through the rarified atmosphere of the sputtering chamber condensing on substrates placed in the chamber as well as on other surfaces within the confines of the chamber. Accordingly, the process of sputtering is distinct from co-evaporation in that, since the atoms are ejected from the target by the impact of inert gas ions rather than by evaporation, deposition rate control is achieved by controlling the voltage and electrical power applied to the target, rather than by controlling its temperature. Furthermore, it is possible to sputter deposit a thin film of tungsten silicide from a source made up of tungsten silicide compound so that the control of only one source rather than two is required. This reduction in process complication is a material advantage in semiconductor manufacture. The deposition of tungsten silicide thin film by sputtering is thereby generally simpler than deposition by co-evaporation. Accordingly, with respect to ease of processing, sputter deposited WSi$_2$ has distinct advantages over co-evaporated WSi$_2$. The greater the uniformity of the film, that is, less variation of W:Si atomic ratio, produces better run-to-run reproducibility and the avoidance of complex simultaneous evaporation control. However, these processing advantages are offset by the increase in resistivity values of the deposited films. The electric resistivity values of thin films of WSi$_2$ deposited by sputtering and subsequently annealed at temperatures up to 1,000° C. have been 2-3 times greater than the resistivity values of annealed co-evaporated films. This higher resistivity when compared with similarly annealed co-evaporated films has been reported by Mohammadi et al., J. Electrochem. Soc. 127, 450 (1980); Miller, Int. Conf. Metallurg. Coatings, San Diego Ca., Apr. 21-25, 1980. To achieve conductivity values in sputtered WSi$_2$ films comparable to those obtained in co-evaporated films, it has been necessary to anneal the sputtered films at temperatures about 200° C. higher than those required for co-evaporated films. Specifically, optimum conductivity values occur in sputtered WSi$_2$ films annealed at 1,200° C. whereas in the case of co-evaporated WSi$_2$ films optimum conductivity values are achieved during 1000° C. annealing. This higher annealing temperature requirement for sputtered WSi$_2$ films could be intolerable in some processes because of increase of dopant diffusion and different oxidation characteristics. Accordingly, sputtering per se while offering processing advantages suffers from significant deficiencies vis-a-vis the resulting structure.

Within the prior art, there are many references dealing generally with tungsten silicide films, however, none appear to be directed to the specific application of the present invention, namely the use of a specific layer deposited prior to annealing to improve conductivity.

For example, in "Electrical Characteristics and Thermal Stability of Platinum Silicide-to-Silicon Ohmic Contacts Metalized with Tungsten", J. Electrochem. Soc. 120, 1767 (1973) the reference refers to the formation of $WSi_2$ over PtSi-to-Si contacts. As set forth in that reference, the formation of $WSi_2$ occurs as result of Si diffusion through a PtSi layer and a Si-W reaction at temperatures exceeding 800° C. The article concludes that formation of $WSi_2$ should be avoided because it is a degradation of the W metalization. Although, the reference indicates that $WSi_2$ has several desirable properties such as metallic conductivity and oxidation resistance in air at 900° C., however, it refers specifically to avoiding its formation at contact areas. The formation in contact areas was reported as having effects ranging from no change in contact resistivity to an electrical "open condition".

Also within the prior art, methods are known for the deposition of a refractory metal silicide by either sputtering or co-evaporation onto polycrystalline silicon. However, the use of platinum conductivity promoting layers between the silicide and the polycrystalline silicon or on top of the silicide is not disclosed. Patents such as U.S. Pat. No. 4,141,022 also disclose a refractory metal contact system used for an IGFET wherein PtSi forms an underlayer and a sputter deposited film of TiW forms the upper layer of the contact system. Other patent literature that has been considered but deemed to be not specifically germane include U.S. Pat. Nos. 3,777,364; 2,806,361; 3,906,540; and 3,950,233.

Accordingly, while the prior art has developed an impressive array of process techniques, material disadvantages are inherent in each system. Given the known advantages of tungsten silicide in terms of metallic conductivity and relatively low electrical resistivity, its usefulness as an electrical conductor in microelectronic systems can be generalized as relying on four factors: (1) the resistivity of the material in thin film form, (2) the ability of the film to withstand corrosion, (3) the resistance of the film to attack by chemical agents employed in microelectronic circuit fabrication, and (4) the ability to electrically insulate the film. Achievements in depositing low resistivity films have been described herein and are known in the prior art. Presently, techniques are employed utilizing heavily doped polycrystalline silicon layers in applications where tungsten silicide is a potential candidate. Since the resistivity of the heavily doped polycrystalline silicon is about 600 $\mu\Omega$-cm, a sizable conductivity advantage is achieved by using tungsten silicide. There is experimental evidence that a protective thin film layer of silicon dioxide can be produced by thermal oxidation of tungsten silicide films deposited onto polycrystalline silicon or single crystalline silicon substrates (see: Zirinsky, et al., Appl. Phys. Lett. 33, 76 (1978)). Such a thermally grown overlayer of silicon dioxide provides both good corrosion resistance and electrical insulation. The mechanism by which the silicon dioxide layer can be thermally grown without harming the tungsten silicide layer is believed to be by the diffusion of silicon atoms from the substrate through the thin film layer to the upper surface of the $WSi_2$ layer. Oxidation of the silicon atoms to form silicon dioxide then occurs at the upper surface.

Accordingly, it is an object of this invention to define a highly conductive layer containing the elements Pt, W and Si for use in FET gates and other microelectronic applications where a conductor having one or more of the properties of high conductivity, corrosion resistance, resistance to chemical attack and high temperature compatibility is desired.

Another object of this invention is to define a conductive layer for microelectronic applications which possesses the above properties and which accepts thermal oxidation when deposited onto polycrystalline or single crystal silicon.

Another object of this invention is to define the process utilizing the known advantage of sputtering $WSi_2$ and obtaining electrical conductivity values comparable to those evident in annealed co-evaporated $WSi_2$ while lowering the annealing temperature to a level similar to those employed in co-evaporation techniques.

Yet another object of this invention is to define a thin platinum interface layer used between polycrystalline or single crystal silicon and sputtered or co-evaporated $WSi_2$ to achieve high conductivity in the sputtered $WSi_2$ layer.

Still another object of this invention is to define a thin platinum layer used on top of sputtered or co-evaporated $WSi_2$ to achieve high conductivity in the $WSi_2$ layer.

A still further object of this invention is to define an improved FET gate utilizing a highly conductive layer of Pt incorporated with sputtered or co-evaporated $WSi_2$ to improve the conductivity of the gate.

SUMMARY OF THE INVENTION

The present invention employs a layer of Pt in conjunction with sputter deposited or co-evaporated $WSi_2$ to enhance the conductivity increase of the $WSi_2$ layer occurring during annealing. The Pt is deposited as a thin layer directly atop or beneath the $WSi_2$ layer, or may be incorporated within the $WSi_2$ layer. While the platinum interface layer can be used with either sputtered or co-evaporated $WSi_2$ films, the preferred technique is to use sputtering techniques. By using the platinum interface layer, the resistivity of the sputtered or co-evaporated tungsten silicide is lowered beyond those values which typically have been achieved. The lower resistivity of sputtered tungsten silicide then becomes more comparable to that of co-evaporated tungsten silicide yet achieving simpler deposition control afforded in the sputtering process. As a result, the process avoids the penalty of the 2-3 fold increase in thin film resistivity previously incurred when sputter deposition was considered as an alternate to co-evaporation of $WSi_2$.

The method in accordance with the present invention involves the deposition of a thin-film layer of platinum either directly below or directly above the tungsten silicide layer followed by diffusion of platinum into the tungsten silicide. The diffusion of platinum into the tungsten silicide occurs during subsequent high temperature annealing included in the fabrication of the microelectronic circuit. In the preferred embodiments, the platinum layer thickness is chosen to be approximately 10% of the thickness of the tungsten silicide layer.

The resulting annealed tungsten silicide film having platinum atoms diffused into it has demonstrated lower resistivity values than in comparably deposited annealed films in which the platinum layer has been omitted. After the platinum layer has been diffused into the tungsten silicide layer, the film can still be oxidized to produce a silicon dioxide passivation layer. This technique is known and has been described for use with tungsten silicide layers per se. Utilizing this method, either co-evaporated or sputtered tungsten silicide films can be used. However, the most significant decreases in resistivity have been achieved with sputtered films. This is contrasted with the appreciably high resistivities that have been reported with sputtered films alone when compared to co-evaporated films.

In accordance with the present invention, a novel structure for contacts and for conductors of semiconductor devices and for gates of FET semiconductor devices is defined having a conductivity promoting layer of platinum and a tungsten silicide layer deposited onto a suitable substrate. In many instances, the substrate will contain a top-most layer of polycrystalline silicon, however, a single crystal silicon or other suitable materials comprising or deposited onto the substrate may be present in place of the polycrystalline silicon layer. The layering can be reversed with the platinum serving either as an underlayer or an overlayer to the $WSi_2$. Also, alternate multiple layers of platinum and tungsten silicide can be utilized.

This invention will be defined in greater detail by referring to the attached drawings and the preferred embodiments and the description of the preferred embodiments is as follows.

DESCRIPTION OF THE PREFERRED EMBODIMENTS

Figure 1:
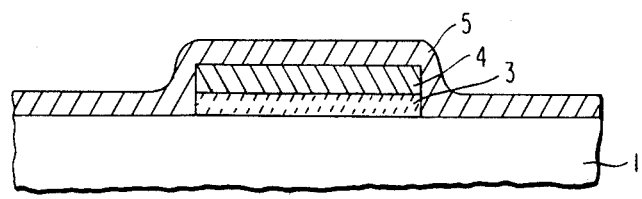
FIG. 1 shows the schematic cross-section of a first semiconductor device utilizing a tungsten silicide layer for microelectronic applications.

Referring now to FIG. 1, a first typical structure utilizing tungsten silicide layers for microelectronic applications is shown. In FIG. 1, a polycrystalline silicon layer 3 and a tungsten silicide layer 4 are deposited and patterned on a substrate 1. A cover layer 5 is typically deposited or thermally grown silicon dioxide and covers the layers 3 and 4.

Figure 2:
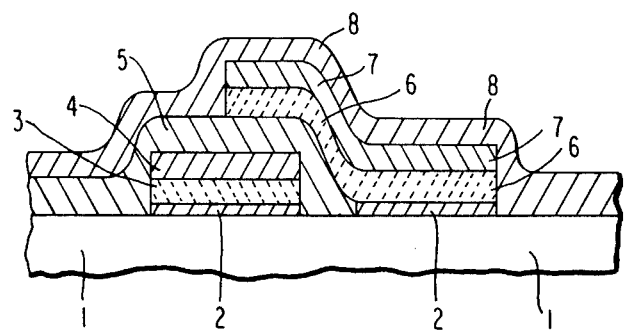
FIG. 2 is a cutaway schematic of a second semiconductor structure utilizing tungsten silicide layers.

FIG. 2 shows an application wherein the polycrystalline silicon and tungsten silicide layers act as a gate electrode of a field-effect transistor (FET). In this application, the substrate 1 includes a thin silicon dioxide layer 2 onto which the polycrystalline silicon layer 3 and the tungsten silicide layer 4 are then deposited. As in the case of the FIG. 1 embodiment, an insulating layer of silicon dioxide 5 covers the layers 3 and 4. As shown in FIG. 2, the gate structure also includes a layer 6 of polycrystalline silicon and a second layer 7 of tungsten silicide. These two layers are electrically insulated from the lower layers 3 and 4 by the dielectric silicon dioxide layer 5. The layers are passivated by a second dielectric layer 8.

Figure 3:
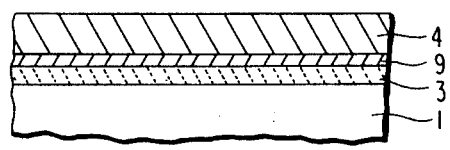
FIG. 3 shows a first embodiment of the present invention utilizing a platinum underlayer.

Referring now to FIG. 3, a first preferred embodiment of the present invention is shown as a cutaway schematic cross-section. In FIG. 3, a platinum layer 9 having a thickness in the range of 10–40 nm is deposited onto a substrate 1 composed of or overlaid with a single crystalline or polycrystalline silicon layer 3. The platinum layer may be deposited by conventional means of evaporation or sputtering. The tungsten silicide layer 4 is deposited by co-evaporation or by sputtering to a thickness of typically 100–500 nm. The resulting structure is then ready for annealing. In accordance with the present invention, the platinum layer 9 is approximately 10% of the thickness of the tungsten silicide layer 4.

FIG. 3 describes an embodiment wherein platinum is the underlayer. In contrast, FIG. 4 shows the converse situation wherein the tungsten silicide and platinum depositions have been reversed.

Figure 4:
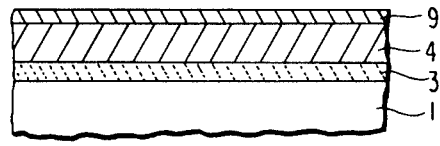
FIG. 4 shows a second embodiment of the present invention utilizing a platinum overlayer.

In FIG. 4, the same substrate layers 1 and 3 comprise a single crystalline or polycrystalline silicon layer 3 comprising or deposited onto a suitable substrate 1 the same as in FIG. 3 embodiment. However, in FIG. 4 the tungsten silicide layer 4 is deposited directly on the substrate layer 3 followed by an overlayer of platinum 9. The relationship of thickness, namely the platinum layer being approximately 10% the thickness of the tungsten silicide layer, is true in the FIG. 4 embodiment.

Figure 5:
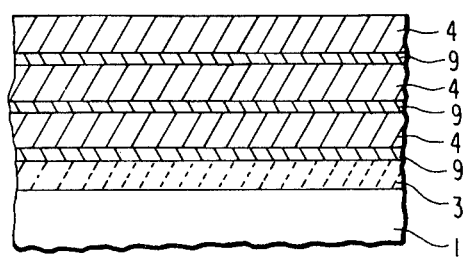
FIG. 5 shows a third embodiment of the present invention utilizing all good layers of platinum and tungsten silicide.

Referring now to FIG. 5, a third preferred embodiment of this invention is shown where thicker layers of tungsten silicide are desired. In the FIG. 5, embodiment the identical substrate as in FIGS. 3 and 4 embodiments are utilized with a substrate layer 3 comprising single crystalline or polycrystalline silicon. However, in FIG. 5 alternate layers of tungsten silicide 4 and platinum 9 are deposited. The FIG. 5 shows three such composite layers. The use of multiple layers permits more rapid diffusion of platinum atoms throughout the tungsten silicide than would occur with a single platinum underlayer or overlayer. This more rapid diffusion of platinum permits shorter annealing times than would otherwise be required. Alternating layer depositions are easily achieved in several commercially available sputtering systems having the capacity for more than one sputtering target or in evaporation systems with multiple sources. While FIG. 5 shows three alternate layers that is, a total of 6 layers of platinum and tungsten silicide, it is apparent that the number is only illustrative. More or fewer layers can be utilized. Also, while FIG. 5 shows a platinum underlayer system, it is apparent that consistent with the embodiment of FIG. 4 the layering may be reversed with the tungsten silicide deposited directly on top of the substrate layer 3 followed by platinum layer 9, second layer of tungsten silicide, a second layer of platinum and so on. That is, the layered structure may begin with either a platinum layer or a tungsten silicide layer, and may end with either layer.

Figure 6:
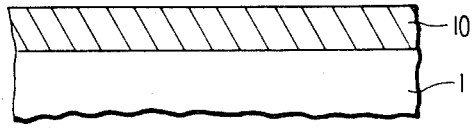
FIG. 6 shows the embodiment of FIG. 5 after annealing.

In the FIG. 5 embodiment, after a sufficient number of layers have been built up, annealing occurs for a sufficient length of time at a temperature of 800° C. or higher. The resulting film structure is that depicted in FIG. 6 wherein a layer 10 over the substrate layer 1 exists having tungsten silicide containing platinum. As shown in FIG. 6, a discrete platinum layer no longer exists following the step of annealing. The FIG. 6 structure can be verified by Auger sputter profiling analysis of properly annealed films prepared utilizing the embodiments of FIGS. 3, 4 or 5. The resulting layer 10 shown in FIG. 6 can then be patterned and oxidized as desired, for example that shown in FIGS. 1 and 2 by methods similar to those which would be used on tungsten silicide alone. If, for example, the passivation layer such as layer 5 of FIGS. 1 and 2 is to be deposited, rather than being thermally grown silicon dioxide, the constraint that the uppermost layer of the substrate prior to platinum and tungsten silicide deposition be single crystalline or polycrystalline silicon is no longer mandatory.

The following examples demonstrate the superiority of this invention over prior art co-evaporation and sputtering techniques.

EXAMPLE I

The substrates for this series of experiments were lightly doped-n-type (100)-oriented single crystal silicon wafers onto which 600 nm of polycrystalline silicon had been deposited by low pressure chemical vapor deposition. Onto these substrates, a 20 nm layer of Pt and a 400–500 nm layer of $WSi_2$ were deposited by sputtering. On control samples, the Pt layer was omitted.

The sputter deposition system used was a Materials Research Corporation Model 822 "sputtersphere" operated in a rf diode configuration. The sputtering system accomodates multiple targets (up to a maximum of four) which can be sequentially rotated into position for sputtering. Round planar targets of 8-inch diameter were used, one target composed of Pt and the other made of hot-pressed $WSi_2$ powder. Target powers of 400–500 watts were used with a sputtering pressure of 10 mTorr of argon gas. The sputtering chamber was evacuated to a pressure less than $1\mu$ Torr prior to admitting the argon sputtering atmosphere. Typical deposition rates under these operating conditions were 20 nm/min for Pt and 12 nm/min for $WSi_2$. Comparisons were then made of the sheet resistance values of co-evaporated $WSi_2$ sputtered $WSi_2$ and sputtered $Pt/WSi_2$ structures after annealing for one hour in a non-oxidizing atmosphere at various temperatures.

TABLE I

| | Sheet Resistance in /□ | | |
|---|---|---|---|
| | Film | | |
| Temp. | Co-evaporated $WSi_2$ | Sputtered $WSi_2$ | Sputtered $Pt/WSi_2$ |
| 800° C. | — | ~12 to 20 | ~9 to 12 |
| 900° C. | 1.5 | — | 3 |
| 1000° C. | 1.5 | 3.5 to 5.5 | 1.5 |
| 1100° C. | 1.5 | 2.5 | 1.2 |

As shown in the above Table I, the sputtered $Pt/WSi_2$ structure has a higher conductivity value (lower sheet resistance) than sputtered $WSi_2$ alone. The values which are obtained using $Pt/WSi_2$ are comparable to those which have been achieved utilizing co-evaporated $WSi_2$. A degree of surface roughening was noted upon annealing of the $Pt/WSi_2$ structure at temperatures in the range of 1,000°–1,100° C. This surface texturing may be decreased by utilizing a thinner layer of Pt. Evidence that the $Pt/WSi_2$ structure was thermally oxidizable was obtained by subjecting a sample to the following oxidation cycle at 1,000° C.: 20 minutes in an argon atmosphere followed by 15 minutes in a steam atmosphere followed by a return to the argon atmosphere prior to withdrawing the sample from the hot zone of the furnace. A moderately good oxide quality was obtained.

EXAMPLE II

Utilizing comparable techniques of sputtering and co-evaporation, tests were conducted to compare the resistivity values of tungsten silicide films prepared by co-evaporation and by sputtering following various annealing treatments. The substrates were as described in Example I. Films in accordance with FIGS. 3 and 4 utilizing a platinum underlayer or overlayer were prepared. The resistance values measured in $\mu\Omega$-cm were measured and are presented in the following table.

TABLE II

| | Resistivity, in $\mu\Omega$-cm, of Annealed $WSi_2$ Films With and Without Pt | | | |
|---|---|---|---|---|
| | Anneal Temperature | | | |
| Film | 800° C. | 900° C. | 950° C. | 1000° C. |
| Co-evap. $WSi_2$ | 140 | 100 | — | 70 |
| Co-evap. $WSi_2$/Sput. Pt. (Pt overlayer) | 110 | 60 | 40 | — |
| Sput. $WSi_2$ | 600–700 | 500 | — | 150–250 |
| Sput. Pt/Sput. $WSi_2$ (Pt underlayer) | 400 | 150 | — | 80 |
| Sput. $WSi_2$/Sput. Pt (Pt overlayer) | — | 240 | 80–120 | — |

As shown in the above Table II, an improvement in conductivity is achieved by addition of platinum which diffuses into the tungsten silicide layer during annealing for one hour in a non-oxidizing atmosphere. The use of a platinum underlayer or overlayer results in resistivity values which are within the range of those obtained by co-evaporation of $WSi_2$ without any Pt layering.

EXAMPLE III

Experiments were conducted to directly compare the thin film of Pt used in conjunction with a $WSi_2$ thin film layer where the Pt is used as both an overlayer and an underlayer. A 20 nm film of Pt was used as an overlayer to determine the increase in post-annealing conductivity of both co-evaporated and co-sputtered $WSi_2$ thin films. The substrates used were as described for Example I. The co-sputtered $WSi_2$ films were prepared in a second rf sputtering system, a Perkin-Elmer/Ultek Model 4400, operated in a planar magnetron configuration at a total rf power of 1,000 watts with a sputtering pressure of 10 mTorr of argon gas. A power splitting feature on this system allowed a tungsten target and a silicon target to be simultaneously powered at selectable levels to achieve the desired stoichiometry in the co-sputtered $WSi_2$ film. Annealing was done for 1 hour in a non-oxidizing atmosphere of argon or nitrogen or a "forming gas" (nitrogen/hydrogen mixture). The results were normalized and compared with the data obtained in Experiment in Table I which utilize a Pt underlayer. Table III below summarizes the data. The $WSi_2$ films used in this experiment were in most cases thinner than the 400–500 nm film thickness employed in the testing done pursuant to Example I. For purposes of comparison, Table III presents sheet resistance values obtained pursuant to this example that have been normalized to values that would be applicable to films having a comparable thickness, that is 400 nm.

TABLE III

| Sheet Resistance Values (in $\Omega$/□) with Pt Overlayer Annealed into $WSi_2$ Films of 400 nm Thickness | | | |
|---|---|---|---|
| Annealing Temperature | Co-Evaporated $WSi_2$ Film | Co-Sputtered $WSi_2$ Film | Sputtered $WSi_2$ Film |
| 800° C. | 2.8 | — | — |
| 900° C. | 1.4 | 3.0–4.0 | 6 |
| 950° C. | 1.0 | 2.0–3.0 | 3.0 |

As used in Table III co-evaporation refers to simultaneous evaporation of W and Si from separate sources at evaporation rates adjusted to yield a deposited film of the desired stoichiometry. Co-sputtering means simultaneous sputter deposition of W and Si from separate W and Si sputtering targets. Each target is powdered to an appropriate level such that the sputter-deposition rates produce a deposited film having the desired stoichiometry. Co-sputtering is compared with the sputtering techniques utilized in Example II where previous films were produced by sputter deposition from a single target comprising a hot-pressed powder of $WSi_2$ compound.

The above examples clearly show that by utilizing a thin Pt layer either as an overlayer or underlayer relative to the sputtered $WSi_2$, high conductivity values, comparable to sputtered $WSi_2$ layers alone are achieved while utilizing annealing temperatures similar to those adequate for co-evaporated $WSi_2$ films. Therefore, the present invention offers material improvements in processing or allowing the utilization of less complicated sputtering techniques, yet, utilizing annealing temperatures which are comparable to those used in conjunction with co-evaporation of $WSi_2$.

It is apparent that changes and modifications can be made without departing from the essential scope of this invention. For example, results similar to those presented in the Examples would be achieved if the pt layer or layers were deposited by evaporation instead of by sputtering.

Also, a sputtering target containing Pt and $WSi_2$ could be employed. Such a target could be prepared by one of the following methods: (a) hot-pressing a mixture of Pt and $WSi_2$ powders; (b) hot-pressing a mixture of PtSi and $WSi_2$ powders; or (c) reactively hot-pressing a mixture of Pt, W and Si powders. Alternatively, strips, segments or a wire mesh of Pt could be mounted across the face of a $WSi_2$ target and the samples rotated to obtain better uniformity. This technique is disclosed in IBM Tech. Disclo. Bull. 20, 1597 (1977) and IEEE Trans. Magnet. MAG-14, 941 (1978). Adjustment of the segment proposition or wire size allows tailoring of the Pt to $WSi_2$ proportion to the desired composition.

Sputtering from such a target would produce results similar to those presented in the examples, i.e., a deposited film having Pt atoms incorporated throughout the $WSi_2$ layer. Annealing would still be required to attain high conductivity. This is because annealing induces crystallization and grain growth in the $WSi_2$ which is typically deposited as an amorphous material, whether by sputtering or co-evaporation. Since the Pt atoms would be incorporated in the $WSi_2$ layer in the same manner as observed using Auger techniques, an enhancement of the post-annealing conductivity of the sputtered $WSi_2$ will occur, commensurate with that presented herein for layered Pt/$WSi_2$ structure subjected to annealing.

I claim:

1. A semiconductor device comprising; a substrate, a first polycrystalline silicon layer on said substrate, a first layer of tungsten silicide having platinum atoms diffused throughout and a cover layer of silicon dioxide.

2. A semiconductor device of claim 1 further comprising an insulating layer of silicon dioxide interposed between said substrate and said polycrystalline silicon layer.

3. A semiconductor device of claims 1 or 2 further comprising second layers of polycrystalline silicon and tungsten silicide having platinum atoms diffused throughout the tungsten silicide and an isolating layer of silicon dioxide interposed between said first and second layers of polysilicon and tungsten silicide to electrically insulate said first and second layers from each other.

4. A microelectronic device comprising; a semiconductor substrate having a conductive tungsten silicide layer with platinum atoms distributed therein.

* * * * *